United States Patent
Rankin

(10) Patent No.: US 6,274,829 B1
(45) Date of Patent: Aug. 14, 2001

(54) WIRELESS INDUCTIVE COUPLED SWITCH

(75) Inventor: Brent C. Rankin, Lima, OH (US)

(73) Assignee: Honda of America Manufacturing, Inc., Marysville, OH (US)

( * ) Notice: Subject to any disclaimer, the term of this patent is extended or adjusted under 35 U.S.C. 154(b) by 0 days.

(21) Appl. No.: 09/517,670

(22) Filed: Mar. 2, 2000

(51) Int. Cl.⁷ .................................................. H01H 35/00
(52) U.S. Cl. ........................................ 200/52 R; 361/179
(58) Field of Search ........................... 200/202, 205–208; 361/170, 179, 187

(56) References Cited

U.S. PATENT DOCUMENTS

| | | | |
|---|---|---|---|
| 4,071,714 | * | 1/1978 | Satoh ..................................... 179/82 |
| 4,322,701 | * | 3/1982 | Drapeau ............................... 335/202 |
| 4,980,526 | * | 12/1990 | Reneau ................................ 200/61.45 |
| 5,416,293 | * | 5/1995 | Reneau .......................... 200/61.45 M |
| 5,578,977 | * | 11/1996 | Jansseune ............................ 335/207 |
| 5,731,666 | * | 3/1998 | Folker et al. ........................ 315/276 |
| 5,831,802 | * | 11/1998 | Ahmed et al. ............................ 361/1 |
| 6,130,489 | * | 10/2000 | Heimlicher ........................... 307/125 |

* cited by examiner

*Primary Examiner*—Karl D. Easthom
*Assistant Examiner*—Nhung Nguyen
(74) *Attorney, Agent, or Firm*—Barbara Joan Haushalter; Alan T. McDonald

(57) ABSTRACT

A device is provided for allowing detection of a switch closure across an air gap between components. The device comprises a wireless inductive coupled switch designed for use with any suitable proximity sensor. The switch and sensor transmit a switch closure at a closable switch across the air gap. When the wireless inductive coupled switch is moved into the sensing range of the inductive proximity sensor, the ferrite core portion of the inductive coupled switch and the coil surrounding the ferrite portion are inductively coupled by the alternating field generated by the inductive proximity sensor. The alternating magnetic flux lines of the inductive proximity sensor move back and forth through the ferrite core portion and the coil. As long as the closable switch is open, no current is induced into the coil. When the switch is closed, the electrical path through the coil is complete, allowing current to be induced from the alternating field generated by the inductive proximity sensor into the coil of the wireless inductive coupled switch.

19 Claims, 3 Drawing Sheets

WIRELESS INDUCTIVE COUPLED SWITCH

FIELD OF THE INVENTION

This invention relates generally to industrial application switches and, more particularly, to a wireless inductive coupled switch for detection of switch closure across an air gap.

BACKGROUND OF THE INVENTION

Often, a machine will have multiple moving parts on which it is desired to detect switch closure. Currently, wires are moved around and between the moving parts to detect proper line up of switches, such as proximity switches, across some distance between components. As portions of equipment are moved from one position to another, proper positioning is detectable using the wired detection means. However, arranging and moving the wires for detection around the moving equipment can result in breakage of the wires.

Although the existing art proposes some wireless methods for detecting a switch closure across an air gap, these existing methods are quite complex. For example, using radio signals requires a small radio transmitter and receiver. Transmitting signals or data across the air gap then requires additional electronics in both the transmitter and receiver.

It would be desirable, then, to have a less complex method for detecting switch closure across an air gap.

SUMMARY OF THE INVENTION

This need is met by the present invention wherein a wireless inductive coupled switch is provided for detection of switch closure across an air gap.

In accordance with one embodiment of the present invention, a device is provided for detecting switch closure across an air gap. The device comprises a wireless inductive coupled switch for use with a proximity sensor to transmit a switch closure across an air gap.

Objects and advantages of the invention will be apparent from the following description, the accompanying drawings and the appended claims, to which reference may be had for a full understanding of the nature of the present invention.

DESCRIPTION OF THE PREFERRED EMBODIMENT

Figure 1:
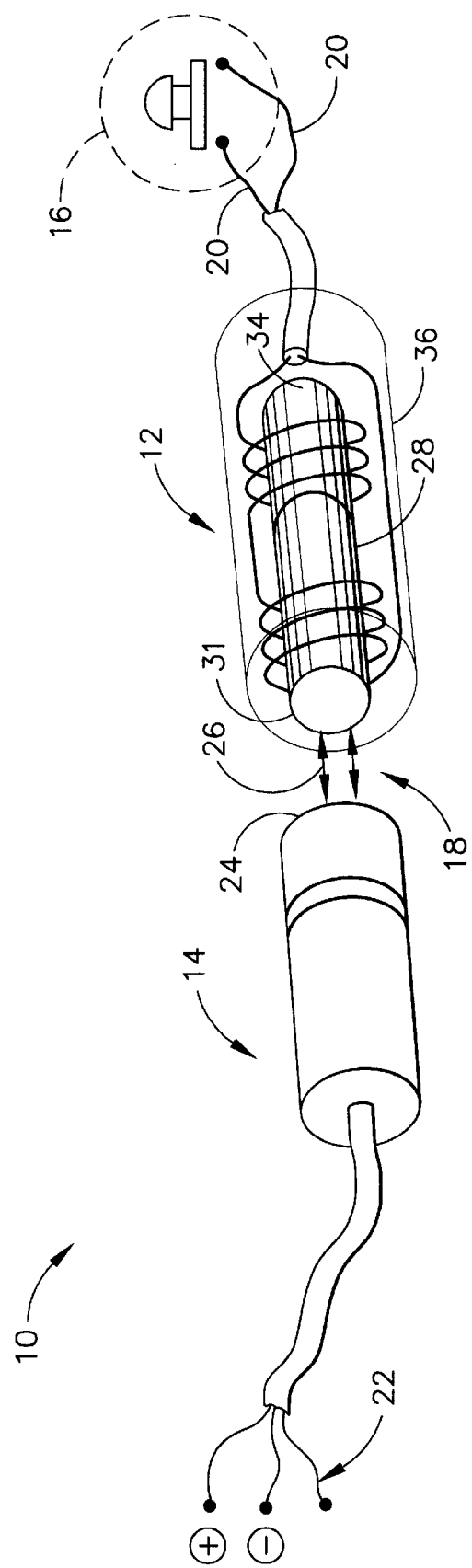
FIG. 1 illustrates a device for detecting a switch closure across an air gap.

Referring to FIG. 1, a device 10 allows for detection of a switch closure across some space between components. The device 10 comprises a wireless inductive coupled switch 12 designed for use with any suitable proximity sensor 14. The switch 12 and sensor 14 transmit a switch closure at 16 across an air gap 18.

The wireless inductive coupled switch 12 is aligned within the sensing range of the standard inductive proximity sensor 14. When the closable switch 16 is closed, shorting the input wires 20, the induction of the wireless switch 12 increases to the point where it is detected by the proximity sensor 14. This activates the proximity sensor 14, turning on sensor output 22, thereby indicating switch closure.

Figure 2:
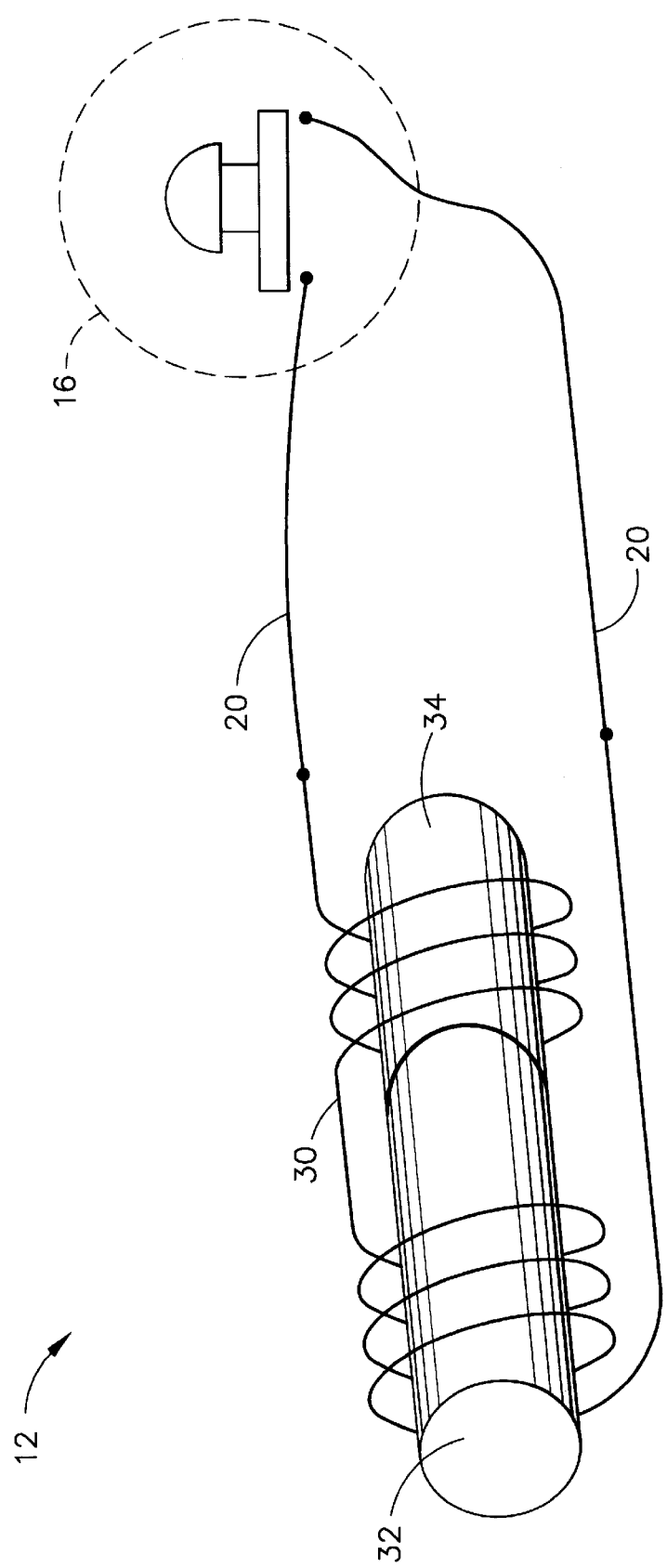
FIG. 2 is a wireless inductive coupled switch portion of the device of FIG. 1.

Referring now to FIG. 2 and continuing with FIG. 1, the wireless inductive switch 12 can be used in conjunction with standard inductive proximity sensors of various sizes and sensing distances. During normal operation, the sensing end or front end output 32 of the wireless inductive switch 12 is aligned with the sensing end 24 of the proximity switch 14, as indicated by arrows 26 of FIG. 1.

The inductive switch 12 comprises a bi-metal core 28 which is wrapped with magnetic wire 30. In a preferred embodiment, the bi-metal core comprises a ferrite portion 32 and a steel portion 34. A coil 30 of twenty-eight-gauge wire is wound around the core 28 in a predetermined pattern. Preferably, the wire is wound in the same direction on the ferrite portion 32 and the steel portion 34, and can be either clockwise or counterclockwise. For example, beginning at the sensing or ferrite end of the core 28, approximately 20% of the ferrite rod portion 32 is wrapped with wire 30. Then the wire 30 extends back to the steel rod portion 34 of the core 28, so the steel portion is tightly wrapped and completely covered with a single layer of wire.

The two ends of the magnetic wire of coil 30 are then connected to a length of the hook-up wire 20 which is used to connect to the switch-type device 16. The core 28, including ferrite 32 and steel 34, and the coil assembly 30 is encased in a non-ferrous, non-magnetic housing 36, as illustrated in FIG. 1. The housing 36 may be any suitable material, such as plastic.

Figure 3:
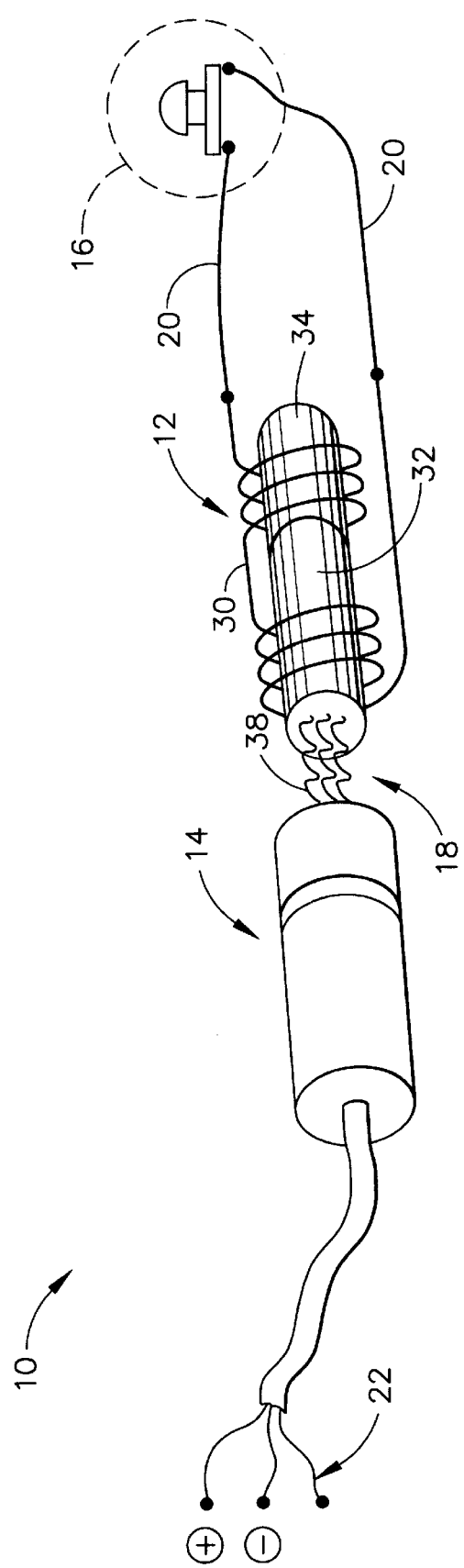
FIG. 3 illustrates the electrical relationship between the portions of the device of FIG. 1, for detecting switch closure.

When the wireless inductive coupled switch 12 is moved into the sensing range of the inductive proximity sensor 14 to form air gap 18, the ferrite core portion 32 and the coil 30 surrounding the ferrite portion 32 are inductively coupled by the alternating field 38, illustrated in FIG. 3, generated by the inductive proximity sensor 14. The alternating magnetic flux lines of alternating field 38 of the inductive proximity sensor 14 move back and forth through the ferrite core portion 32 and the coil 30. As long as the closable switch 16 is open, no current is induced into the coil 30. When the switch 16 is closed, the electrical path through the coil 30 is complete, allowing current to be induced from the alternating field 38 generated by the inductive proximity sensor 14 into the coil 30 of the wireless inductive coupled switch 12.

Since the inductive proximity sensor 14 and the inductive coupled switch 12 are magnetically linked, when the current changes in the coil 30 of switch 12, the current also changes in the sensor 14, activating the alternating field 38 and turning on the output 22 of the sensor 14.

Having described the invention in detail and by reference to the preferred embodiment thereof, it will be apparent that other modifications and variations are possible without departing from the scope of the invention defined in the appended claims.

What is claimed is:

1. A device for detecting switch closure across an air gap, the device comprising:
   an inductive proximity sensor having a sensing range at least equal to the air gap;
   a wireless inductive coupled switch aligned at one end at the air gap distance from the proximity sensor and within the sensing range of the proximity sensor and cooperating at the other end with a closable switch, the closure of which is to be detected;
   the proximity sensor and the wireless inductive coupled switch being magnetically linked across the air gap, such that current changes in the closable switch changes induction in the wireless inductive coupled switch, thereby inductively changing current in the proximity sensor to indicate closure of the closable switch across the air gap.

2. A device as claimed in claim 1 further comprising input means associated with the closable switch and the wireless inductive coupled switch.

3. A device as claimed in claim 2 wherein the closable switch operates to short the input means when the closable switch is closed.

4. A device as claimed in claim 3 wherein induction of the wireless inductive coupled switch increases when the input means is shorted.

5. A device as claimed in claim 4 further comprising detection means associated with the proximity sensor for detecting the increased induction in the wireless inductive switch.

6. A device as claimed in claim 5 further comprising a sensor output associated with the proximity sensor wherein the sensor output is activated when the proximity sensor detects the increased induction in the wireless inductive coupled switch, indicating closure of the closable switch.

7. A device as claimed in claim 1 wherein the wireless inductive coupled switch comprises a bi-metal core.

8. A device as claimed in claim 7 further comprising magnetic wire for wrapping the bi-metal core.

9. A device as claimed in claim 8 wherein the bi-metal core comprises a ferrite portion and a steel portion.

10. A device as claimed in claim 9 wherein about twenty percent of the ferrite portion is covered with the magnetic wire and about one hundred percent of the steel portion is covered with the magnetic wire.

11. A device as claimed in claim 9 further comprising means for inductively coupling the ferrite portion and the magnetic wire wound around the ferrite portion by moving the wireless inductive coupled switch into the sensing range of the proximity sensors alternating field.

12. A device as claimed in claim 11 further comprising means for completing an electrical path through the magnetic wire when the closable switch is closed.

13. A method for detecting switch closure across an air gap, the method comprising the steps of:
providing an inductive proximity sensor having a sensing range at least equal to the air gap;
aligning a wireless inductive coupled switch so that one end is at the air gap distance from the proximity sensor and within the sensing range of the proximity sensor and cooperating at the other end with a closable switch, the closure of which is to be detected;
magnetically linking the proximity sensor and the fireless inductive coupled switch, such that current changes in the closable switch changes induction in the wireless inductive coupled switch, thereby inductively changing current in the proximity sensor to indicate closure of the closable switch across the air gap.

14. A method as claimed in claim 13 wherein the wireless inductive coupled switch comprises a bi-metal core.

15. A method as claimed in claim 14 further comprising the step of wrapping the bi-metal core with magnetic wire.

16. A method as claimed in claim 15 wherein the bi-metal core comprises a ferrite portion and a steel portion.

17. A method as claimed in claim 16 wherein about twenty percent of the ferrite portion is covered with the magnetic wire and about one hundred percent of the steel portion is covered with the magnetic wire.

18. A method as claimed in claim 16 further comprising the step of inductively coupling the ferrite portion and the magnetic wire wound around the ferrite portion by moving the wireless inductive coupled switch into the sensing range of the proximity sensor to generate an alternating field.

19. A method as claimed in claim 18 further comprising the step of completing an electrical path through the magnetic wire when the closable switch is closed.

\* \* \* \* \*